United States Patent
Ward et al.

(10) Patent No.: US 8,426,309 B2
(45) Date of Patent: Apr. 23, 2013

(54) GRAPHENE NANOELECTRIC DEVICE FABRICATION

(75) Inventors: Jonathan W. Ward, Fairfax, VA (US); Michael J. O'Connor, Manassas Park, VA (US)

(73) Assignee: Lockheed Martin Corporation, Bethesda, MD (US)

( * ) Notice: Subject to any disclaimer, the term of this patent is extended or adjusted under 35 U.S.C. 154(b) by 316 days.

(21) Appl. No.: 12/879,400

(22) Filed: Sep. 10, 2010

(65) Prior Publication Data

US 2011/0059599 A1  Mar. 10, 2011

Related U.S. Application Data

(60) Provisional application No. 61/241,359, filed on Sep. 10, 2009, provisional application No. 61/326,561, filed on Apr. 21, 2010.

(51) Int. Cl.
*H01L 21/44* (2006.01)

(52) U.S. Cl.
USPC ...... 438/672; 438/199; 438/153; 257/E21.27; 977/734

(58) Field of Classification Search .......... 438/199, 438/153–154, 672, 675; 257/E21.27; 977/734, 977/855–857
See application file for complete search history.

(56) References Cited

U.S. PATENT DOCUMENTS

| | | | |
|---|---|---|---|
| 7,078,312 B1 | 7/2006 | Sutanto et al. | |
| 7,128,975 B2 | 10/2006 | Inomata | |
| 2007/0131915 A1 | 6/2007 | Stankovich et al. | |
| 2007/0187694 A1 | 8/2007 | Pfeiffer | |
| 2008/0012462 A1 | 1/2008 | Yamage | |
| 2008/0070468 A1 | 3/2008 | Ichikawa et al. | |
| 2009/0011204 A1 | 1/2009 | Wang et al. | |
| 2009/0017211 A1 | 1/2009 | Gruner et al. | |
| 2009/0045161 A1 | 2/2009 | Liebau et al. | |
| 2009/0140801 A1 | 6/2009 | Ozyilmaz et al. | |
| 2010/0200839 A1 | 8/2010 | Okai et al. | |
| 2011/0163296 A1* | 7/2011 | Pace et al. | 257/24 |

OTHER PUBLICATIONS

Jessica Campos-Delgado, et al. "Bulk Production of a New Form of sp2 Carbon: Crystalline Graphene Nanoribbons", Nano Letters, vol. 8, No. 9, pp. 2773-2778, (2008).

D.C. Elias et al., "Control of Graphene's Properties by Reversible Hydogenation: Evidence for Graphane", vol. 323, pp. 610-613, Jan. 30, 2009 www.sciencemag.org.

William Regan et al., "A direct transfer of layer-area graphene", Applied Physics Letters 96, 113102 (2010).

Woo Sik Kim et al., "Fabrication of graphene layers from multiwalled carbon nanotubes using high dc pulse", Applied Physics Letters 95, 083103 (2009).

(Continued)

*Primary Examiner* — Thanhha Pham
(74) *Attorney, Agent, or Firm* — McDermott Will & Emery LLP (57) ABSTRACT

Embodiments of the present invention provide methods for fabricating graphene nanoelectronic devices with semiconductor compatible processes, which allow wafer scale fabrication of graphene nanoelectronic devices. Embodiments of the present invention also provide methods for passivating graphene nanoelectronic devices, which enable stacking of multiple graphene devices and the creation of high density graphene based circuits. Other embodiments provide methods for producing devices with graphene layer segments having multiple thicknesses.

3 Claims, 7 Drawing Sheets

OTHER PUBLICATIONS

S. Masubuchi et al., "Fabrication of graphene nanoribbon by local anodic oxidation lithography using atomic force microscope", Applied Physics Letters 94, 082107 (2009).

Gaanhua Lu, et al., "Gas detection using low-temperature reduced graphene oxide sheets", Applied Physics Letters 94, 083111 (2009).

Damon B. Farmer, Yu-Ming Lin, and Phaedon Avouris, "Graphene field-effect transistors with self-aligned gates", Applied Physics Letters 97, 013103 (2010).

Roman Sordan et al., "Logic gates with a single graphene transistor", Applied Physics Letters 94, 073305 (2009).

J. Krupka and W. Strupinski, "Measurements of hte sheet resistance and conductivity of thin exitaxial graphene and SiC films", Applied Phyics Letters 96, 082101 (2010).

Maxwell Zheng et al., "Metal-catalyzed crystallization of amorphous carbon to graphene", Applied Physics Letters 96, 063110 (2010).

Tim J. Echtermeyer et al., "Nonvolatile Switching in Graphene Field-Effect Devices", IEEE Electron Device Letters, vol. 29, No. 8, Aug. 2008.

Yu-Ming Lin, et al. "Operation of Graphene Transistors at Gigahertz Frequencies", Nano Letters, vol. 9, No. 1, pp. 442-426 (2009).

K.S. Novoselov et al., "Room-temperature electric field effect and carrier-type inversion in graphene films", submitted to Nature on Feb. 5, 2004.

Yun-Hi Lee and Jong-Hee Lee, "Scalable growth of free-standing grahene wafers with copper(Cu) catalyst on SiO2/Si substrate: Thermal conductivity of the wafers", Applied Physics Letter 96, 083101 (2010).

International Search Report dated Nov. 5, 2010 for PCT/US2010/048398.

Written Opinion dated Nov. 5, 2010 for PCT/US2010/048398.

* cited by examiner

GRAPHENE NANOELECTRIC DEVICE FABRICATION

CROSS-REFERENCES TO RELATED APPLICATIONS

This patent application claims priority to U.S. Provisional Patent Application Ser. Nos. 61/241,359 filed Sep. 10, 2009 and 61/326,561 filed Apr. 21, 1010, the disclosures of which are incorporated herein by reference in their entirety.

BACKGROUND OF THE INVENTION

The present invention relates generally to device fabrication, and more particularly to graphene nanoelectronic device fabrication.

Graphene is a crystalline structure of $sp^2$-hybridized carbon bonded together in a honeycomb-like sheet lattice of six-membered rings. Graphene sheets do not readily exist in nature, with graphite being made up of large numbers of graphene sheets layered one on top of another. An individual graphene sheet has a thickness of a single atom, but graphene has only recently been produced or isolated in thicknesses approaching a single sheet. A carbon nanotube may be conceptualized as a nanoscopic segment of a graphene sheet that has been rolled up into a tube shape. Graphene sheets on a nanoscopic or atomic layer scale have the potential for use in a variety of nanoelectronic devices such as field effect transistors, switches, resistors, and interconnects, to name a few. However, while a substantial body of literature exists on the manufacture of carbon nanotubes, experiments for the manufacture of graphene sheets on a nanoscopic or atomic layer scale have generally been conducted using techniques that would be difficult to scale up for commercial application.

For example, one technique to forming graphene is mechanical exfoliation. This technique may be limited because graphene may not be deposited over an entire wafer, and certain coating techniques may produce relatively thick coatings with multiple layers of graphene. Another technique involves thermal decomposition of silicon carbide (SiC) for forming graphene; however, this technique also may not deposit graphene over an entire wafer, and although the thermal decomposition of SiC may be performed with complementary metal oxide semiconductor (CMOS) techniques, the high temperatures needed (e.g., greater than 1400° C.) and the need for a silicon carbide substrate may limit this technique's usefulness beyond basic graphene research.

Some techniques involve chemical reduction of oxidized graphene and chemical intercalation and exfoliation (un-zipping) of multi-walled nanotubes for forming graphene; however, these techniques may produce films where the properties are divergent from mechanical exfoliated or thermally decomposed graphene, and these techniques may not necessarily be conducive with CMOS manufacturing techniques because of the need of non-CMOS compatible chemicals. Another technique for forming graphene is chemical vapor deposition (CVD). This technique for forming graphene may involve the utilization of catalyst materials (e.g., typically thin films of nickel (Ni) or copper (Cu)) and carbonaceous gases. While this technique can readily be implemented into a CMOS foundry, multilayered graphene is often produced, and metal catalyst films may hamper integration into usable devices without further complex process integration.

Thus, there is a need for enhancements to and development of new techniques for the manufacture of graphene sheets on a nanoscopic or atomic layer scale.

SUMMARY OF THE INVENTION

In an exemplary embodiment of the invention, a method of forming a graphene layer is provided. According to this method, a dispersion of functionalized graphene in a solvent is prepared and applied as a coating onto a substrate. The solvent is then evaporated to form a layer of functionalized graphene. The graphene is then defunctionalized to form a graphene layer on the substrate.

In another exemplary embodiment, a method of forming a graphene layer is provided that includes the steps of depositing a layer of graphene or amorphous carbon at least 20 Å thick onto a substrate, and etching the carbon or graphene layer to a thickness of less than 10 Å.

In yet another exemplary embodiment, a method is provided of manufacturing a solid state electronic nanostructure including a graphene layer segment. According to this method, a graphene layer segment is deposited onto a substrate and a protective sacrificial layer is deposited over the graphene layer segment. An electronically insulating layer is deposited over the protective sacrificial layer and one or more openings are etched into the insulator layer. The protective sacrificial layer is then removed to form a cavity between the graphene layer and the insulator layer, thus passivating the graphene layer. An electrically conductive material may then be deposited into the one or more openings in the insulator layer to form electrical contact(s) with the graphene layer, and additional solid state electronic nanocomponents may be formed on or above the insulator layer in electrical contact with the graphene layer segment through the electrical contacts, in order to complete the construction of the solid state electronic nanostructure.

In still another exemplary embodiment, a method is provided for manufacturing a solid state electronic nanostructure including at least one graphene layer segment, where a graphene layer segment having a thickness greater than 20 Å is deposited on a support and optionally patterned using conventional patterning techniques. Then, a mask is applied to protect a portion of the graphene layer segment, and the unprotected portion of the graphene layer segment is etched to a thickness of less than 10 Å. The mask is then removed, thereby providing a graphene layer segment with a portion having a thickness greater than 20 Å and a portion having a thickness less than 10 Å.

These and other features and benefits will become more apparent from the following description taken in conjunction with the drawings.

BRIEF DESCRIPTION OF THE DRAWINGS

The subject matter which is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

In one exemplary embodiment, a dispersion of functionalized graphene in a solvent is prepared and applied as a coating onto a substrate. Exemplary substrates include silicon, thermal oxide, silicon oxide, aluminum oxide, hafnium oxide, silicon nitride, tungsten, tungsten/titanium, aluminum, copper, and other known insulators, semiconductors, or metallic surfaces. Functionalized graphene may be prepared by starting with manufactured graphene fragments. Such graphene fragments are typically prepared by mechanical exfoliation of graphite, and are commercially available. Other techniques may also be used such as opening of carbon nanotubes to form graphene nanoribbons (e.g., in a solution of potassium permanganate and sulfuric acid or by plasma etching of CNT's partially embedded in a polymeric film followed by dissolution of the polymeric film). Another technique to form a graphene based solution is to oxidize High Ordered Pyrolitic Graphite (HOPG) or graphite, which is a known process in the art that uses $H_2SO_4$, $NaNO_3$, and $KMnO_4$ to form graphite oxide. After forming graphite oxide, the flakes can be dispersed in $H_2O$ and then sonicated to form one to several layers of oxidized graphene.

In one exemplary embodiment, the graphene fragments are functionalized with functional groups along the edges of the graphene fragments to promote dispersion in a solvent such as a polar or non-polar solvent. Exemplary functional groups include, but are not limited to, hydroxyl groups, carboxyl groups, nitrile groups, and functionalizing resulting from fluorination. In one exemplary embodiment, graphene fragments may be functionalized by reaction with a strong oxidative etching agent such as $HNO_3$, $H_2O_2$, $H_2SO_4$, or the like. Other functionalizations can be utilized as known in the art. In an exemplary embodiment, reaction with the strong oxidative etching agent may be conducted under conditions of boiling under reflux. The oxidative etching agent may help to shorten graphene nanoribbons (e.g., to widths less than 20 nm), which may assist in producing semiconducting graphene instead of semimetallic graphene. Oxidation can also attach hydrogen groups to the graphene. Functionalization with hydrogen has been shown to produce hydrogenated graphene with semiconducting characteristics while Functionalization with hydroxyl groups tends to provide more insulating characteristics.

The oxidized graphene or functionalized graphene fragments are dispersed in a solvent to form a dispersion for coating. Exemplary solvents include water, isopropanol, methanol, ethanol, dichlorobenzene (substituted at the 1,2- 1,3- or 1,4-positions), chlorobenzine, n-methylpyrrolidinone, dimethylformamide, dimethylsulfoxide, acrylonitrile, hexane, toluene, methylene chloride, and chloroform. The concentration of oxidized graphene or functionalized graphene fragments in solvent can vary widely depending on the specific properties of the fragments, solvent, and substrate. Typical exemplary concentrations may range from about 0.25-5 g/l. Of course, other concentrations may be used as well, as would be understood by one skilled in the art. Centrifugation and sonication of the dispersion may be performed to remove larger nanoribbons or fragments, remove heavy contaminants such as silica particles, and further disperse the oxidized/functionalized graphene fragments into solution.

The dispersion of functionalized graphene fragments in solvent may then be coated onto a substrate using a variety of known coating techniques, including but not limited to spin-coating, spray-coating, dip-coating, or electro-deposition coating (which would require a conductive substrate), effectively creating a fabric of functionalized graphene. Using the spin-coating technique, a uniformly dispersed monolayer of graphene can be deposited over any size wafer using standard semiconductor photoresist coating and developing track, for example by spinning the substrate at about 1000 rpm while depositing the dispersion onto the substrate. Alternatively, a desired amount of dispersion can be deposited onto the substrate followed by spinning. After the dispersion has been deposited onto the substrate, the residual solvent may then be optionally dried by spinning at about 4000 rpm until dry or by heating. In an exemplary embodiment, the spin-coating process produces regions of a single to multiple atomic layer sheets, depending on the solution optical density (measure of carbonaceous material in solution) and the number of coats. In another exemplary embodiment, a coating method produces a coating having a thickness of at least 100 Å, which may be reduced to a thickness of less than 10 Å (before or after converting the layer to graphene) by etching. In a more specific exemplary embodiment, the initial coating thickness may be 12 to 15 Å, and may be reduced to a thickness of less than 7.5 Å. In a still further exemplary embodiment, the layer is reduced to a thickness corresponding to a single atomic layer thickness (i.e., monolayer) graphene sheet.

The etching process, which may be referred to in some exemplary embodiments as atomic layer etching, may be accomplished in different ways. In one exemplary embodiment, such etching may be accomplished by exposing the layer to a remote plasma comprising hydrogen or an inductively coupled plasma comprising hydrogen. In another exemplary embodiment, such etching may be accomplished by adsorbing the layer with a monolayer of hydrogen (e.g., through exposure to a hydrogen gas) or oxygen (e.g., through soaking in deionized water) groups (unless working with graphene before it has been defunctionalized) and then annealing under conditions sufficient to etch the layer. In an exemplary embodiment, such annealing conditions may include a temperature between 800° C. and 1200° C. In another exemplary embodiment, the annealing may be conducted for period between 0.5 minutes and 5 minutes. Longer durations may be used, although additional etching (if any) achieved during such extended periods may be limited.

After removing the solvent from the above-described coated layer, the oxidized or functionalized graphene is defunctionalized (i.e., by removing or driving off the functional groups, or by dehydrogenating) to form a graphene layer. Graphene may be defunctionalized by annealing, for example at a temperature greater than 400° C., in a non-oxidizing environment. The graphene may also be defunctionalized by a chemical reduction with a reducing agent such as hydrazine to form a graphene-like film, as is known in the art by reaction of graphite oxide with reducing agents such as hydrazine.

In another exemplary embodiment, a graphene layer can be formed by depositing carbon onto a substrate using deposition techniques such as chemical vapor deposition (CVD), atomic layer deposition (ALD), or sputtering. CVD and ALD can deposit graphene sheets onto the substrate through the use of a graphene-forming catalyst such as a thin film or sheet of nickel, copper, platinum, ruthenium, palladium, gold, rhodium, or iridium. The catalyst layer can be deposited using known techniques such as physical vapor deposition (PVD). The use of such a catalyst is optional for ALD, but without the catalyst, ALD will deposit amorphous carbon. Sputtering may be used to deposit amorphous carbon.

In order to deposit carbon using CVD, the substrate is pre-heated (e.g., to about 500° C.) and a carbon feedstock (e.g., methane, ethylene, acetylene, and/or other carbon-containing gases) in a carrier gas such as an inert gas (e.g., argon) or a reductant (e.g., hydrogen) is used to deposit carbon in a chemical vapor deposition (CVD) process at elevated temperatures (e.g., 800-900° C.). Control of the CVD process parameters (e.g., temperature) can provide control over the properties of the deposited carbon. The extremely thin metal catalyst layer (e.g., about 1-2 nm) will generally diffuse or vaporize during CVD deposition, and altering the thickness of the metal catalyst layer can provide additional control of the relative proportions of graphitic carbon versus amorphous carbon. The graphene layer may be patterned by depositing a pattern of a sacrificial material or resist over the substrate after PVD of the metal catalyst layer, thus preventing deposition of carbon in the patterned area, and then removing the sacrificial material after the CVD process.

After deposition of the carbon layer, it may be annealed to convert amorphous carbon to graphitic carbon through ordering of the carbon crystal structures to form a single crystal to a polycrystalline granular structure. Annealing may be performed in a non-oxidizing environment (e.g., vacuum, argon, nitrogen) at temperatures of 800° C. to 1200° C. In an exemplary embodiment, this annealing may be carried out for a period from 0.5 minutes to 1 hour. In another exemplary embodiment, the annealing may be carried out for a period of from 0.5 minutes to 5 minutes. Grain size in the polycrystalline granular carbon film may be controlled by varying the temperature and/or duration of this annealing process.

Carbon deposition techniques such as CVD, sputtering, and ALD, and certain coating applications, may produce layer thicknesses of over 5 nm, or over 10 nm in some circumstances, which thickness needs to be reduced to form a graphene layer segment useful for nanoelectronic device applications. It may be desirable to reduce layer thicknesses even for layer thicknesses as low as 2 nm. Conventional etching processes may not be adequate to produce the tightly controlled thickness reductions necessary for etching at the atomic layer scale. Therefore, according to exemplary embodiments of the invention, the carbon layer may be etched to a thickness of less than 1 nm by etching techniques that remove 1 to 100 Å of carbon layer thickness per application. In another exemplary embodiment, the carbon layer may be etched to a thickness that produces a thickness equivalent to a single atomic layer graphene sheet. In yet another exemplary embodiment, the carbon layer may be etched to a thickness that produces a thickness equivalent to a two atomic layers of graphene sheet (i.e., a graphene bi-layer). In still another exemplary embodiment, the carbon layer may be etched to a thickness that produces a thickness equivalent to a three atomic layers of graphene sheet (i.e., a graphene tri-layer). In the literature, the term "graphene" is often used to describe a single layer of graphene, and perhaps bi-layers and tri-layers of graphene, while materials having more layers of graphene may be referred to as "graphite". However, as used herein, the term "graphene" includes both films that comprise multiple layers of graphene sheets stacked one upon another (prior to etching to reduce layer thickness), as well as thinner graphene layers after etching (e.g., mono-, bi-, and tri-layer graphene).

In one exemplary embodiment, the carbon layer thickness can be reduced by functionalizing the layer with monolayered oxygen or hydrogen groups (e.g., by soaking in deionized water or exposure to hydrogen gas), and then annealing under conditions sufficient to etch the layer. In an exemplary embodiment, such annealing conditions may include a temperature between 800° C. and 1200° C. In another exemplary embodiment, the annealing may be conducted for period between 0.5 minutes and 5 minutes. Longer durations may be used, although additional etching (if any) achieved during such extended periods may be limited. Oxygen content in the annealing chamber may be controlled in order to control the amount of carbon loss, with amounts in a non-oxidizing atmosphere being on the order of 1 Å, and greater carbon loss amounts (e.g., >10 Å) potentially being produced if oxygen is present. The level of adsorbed moisture on the surface of the carbon layer may be increased by soaking in water to further enhance layer thickness reduction. Depending on the starting layer thickness, the annealing step can be repeated by re-functionalizing the surface of the carbon layer and annealing again to achieve further layer reductions. Also, atomic layer etching of the carbon layer may be performed before, during, or after conversion of any amorphous carbon in the layer to graphitic carbon, and in an exemplary embodiment the step of annealing to reduce carbon layer thickness may be combined with and performed simultaneous with step of annealing to convert amorphous carbon in the layer to graphitic carbon.

Figure 1:
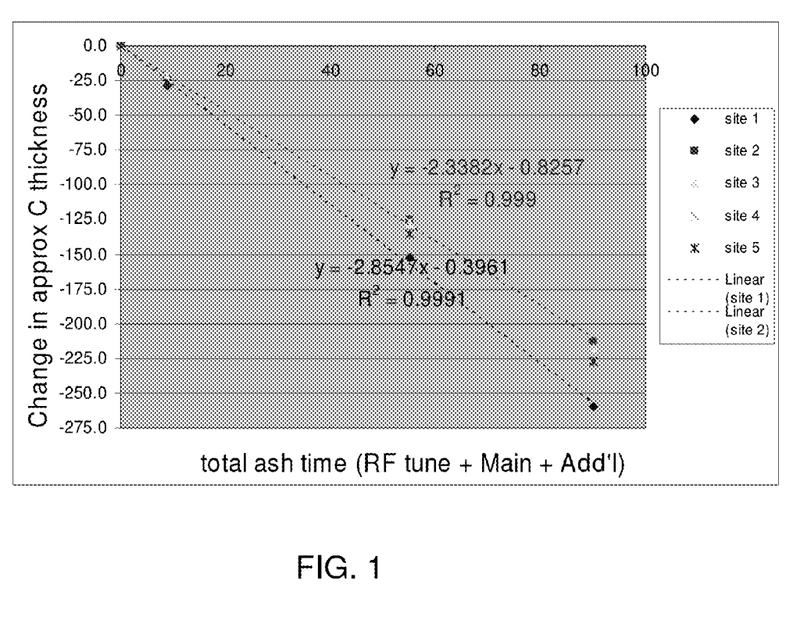
FIG. 1 illustrates a measured etch rate of downstream hydrogen plasma.

In another exemplary embodiment, the thickness of the carbon layer is reduced by exposing it to a remote or inductively-coupled plasma comprising hydrogen. A remote or downstream plasma is utilized in order to avoid the excessive disruption to the remaining graphene layer that could result from direct contact with a plasma stream. In an exemplary embodiment, the plasma contains 1-10 percent hydrogen and 90-99 percent inert gas (e.g., nitrogen, argon), although higher amounts of hydrogen may be used as well, including even a hydrogen-only plasma. In another exemplary embodiment, the plasma is at a temperature of 100° C. to 300° C. In yet another exemplary embodiment, the plasma may be at 0 to 25 W. In still another exemplary embodiment, the pressure of the plasma is at 0.5 to 2 Torr. Of course, other etch-back conditions may be utilized to tailor the etching and hydrogen absorption characteristics. Using these exposure conditions, an etch rate of about 2.4 to 2.9 Å/second for the etch-back process may be achieved. FIG. 1 shows the etch rate data for an approximately 400 Å carbon film, where the thickness was measured with x-ray fluorescence (XRF) (e.g., measures the mass of carbon species on the wafer) from five sites over the wafer.

Figure 2:
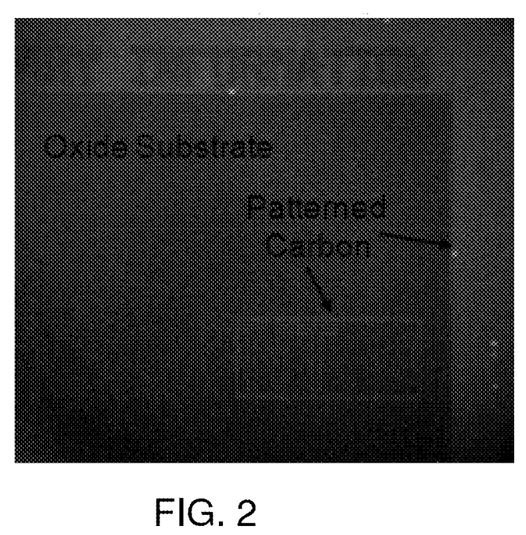
FIG. 2 illustrates an optical image of an etched-back carbon film.
Figure 3:
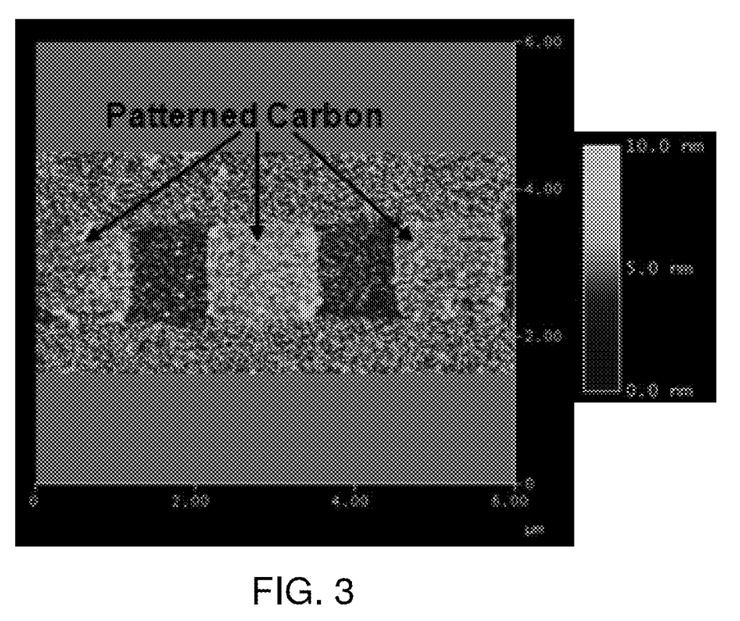
FIG. 3 illustrates an atomic force microscopy (AFM) image of an etched-back carbon film.

According to certain aspects, using the etch rate calculated from the fit of the curves in FIG. 1, a second example is demonstrated where a 55 to 60 Å carbon film is etched-back to a target of 10 to 15 Å, which may correspond to one to two monolayers of graphene. After etching two monitor wafers for about 15.5 seconds and 20 seconds, the wafers measured 15.6 Å and 9.0 Å, respectively. The monitor wafers were then patterned with photolithography and an $O_2$ reactive ion etch (RIE) process, permitting measurement of the thickness of the patterned carbon films with atomic force microscopy (AFM). FIG. 2A shows a dark field optical image of the patterned carbon film after etching that has been etched-back to less than 15 Å with the downstream hydrogen process. AFM measurements were then performed on the patterned etch-backed carbon films (primarily the 13.4 Å film), as shown in FIG. 2B. Height measurements demonstrated that the carbon film is about 10 Å thick, which may correlate to one to two layers of graphene. According to certain aspects, following a post 900° C. anneal for about one minute, the thickness further decreased to 13.4 Å and 6.5 Å, respectively. Thus, the surface of the carbon film may be terminated with hydrogen (resulting from exposure to the plasma), causing the surface of the carbon film to be etched during the anneal. This may allow for an atomic layer etching (ALE) process of the layer to more accurately control the formation of a single layer or bi-layer of graphene. In some aspects, a monolayer of hydrogen adsorbed on the surface of the graphite may be used as an ALE process to further thin the carbon layers. In some aspects, the adsorbed hydrogen can be utilized to create a band-gap in the zero-gap graphene films, thus providing the graphene with an altered electrical state that may be useful for some applications.

Figure 4A:
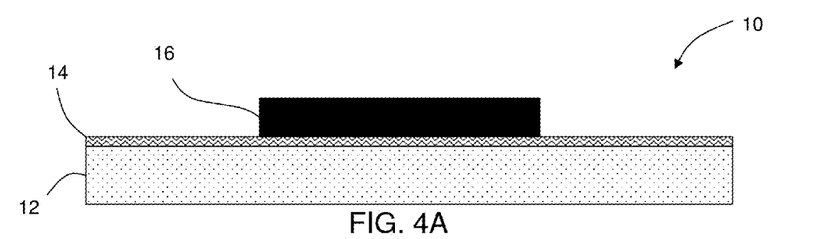
FIGS. 4A and 4B depict a process for patterning a graphene layer segment on a substrate.
Figure 4B:
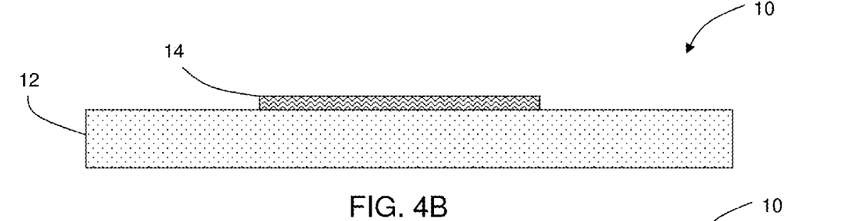

Turning now to FIGS. 4A and 4B, a process is shown for patterning the graphene fabrics according to an exemplary embodiment. It is noted for FIGS. 4-7 that identical reference numbers will be used to identify similar components and elements in different Figures. FIG. 4A shows a nanoelectronic structure 10 having a substrate 12 with a graphene layer or fabric 14 thereon. Photoresist layer 16 is disposed on top of a portion of the graphene layer 14. Standard lithography techniques such as deep-UV photolithography may be employed to pattern the photoresist layer 16. In one exemplary embodiment, a bottom anti-reflective coatings (BARCs) is not used in order to avoid exposing the graphene layer to the $O_2$ ash process required to remove the BARC layer. In the absence of BARC, low exposure doses of UV radiation may be used. Besides deep-UV lithography, alternative lithography techniques such as EUV, electron beam lithography, nano-print lithography, etc. can also be used to pattern the photoresist layer 16 and thus, the graphene fabric 14. The graphene fabric 14 is then etched away in areas not covered by the photoresist layer 16, and the photoresist layer then removed by dissolution with solvent to form the structure shown in FIG. 4B.

In one exemplary embodiment, the graphene fabric 14 is a semiconductor and has a width less than 20 nm, and is over-etched. The graphene fabric may be etched, for example, with an $O_2$ reactive ion etching (RIE) process. Because of the directionality of the etch and the small thickness of the graphene film, controllable over-etches can be performed to significantly reduce the thickness of the photoresist pattern from about 100 nm (close to the lower limit for current 248 nm deep UV lithography with appropriate optics) to about 20 nm, i.e., about 60 nm of lateral loss, which is sufficient for a <350 nm thick resist. To reduce the aspect ratio of the resist, a pre-etch before exposure and developing may be used to thin the resist. A hard mask technique (not shown) can also be used to pattern the graphene layer. The advantage of a hard mask process is that BARC can be employed; however, it may be more difficult to reduce the width of the graphene layer.

Figure 5A:
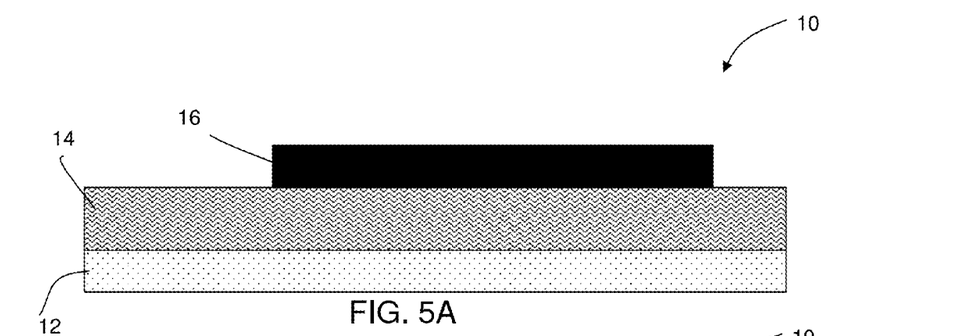
FIGS. 5A-5C depict a process for forming a device with a graphene layer segment having portions with different thicknesses.
Figure 5B:
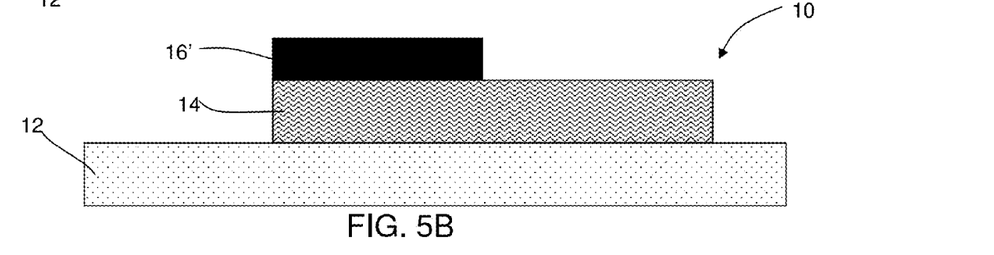
Figure 5C:
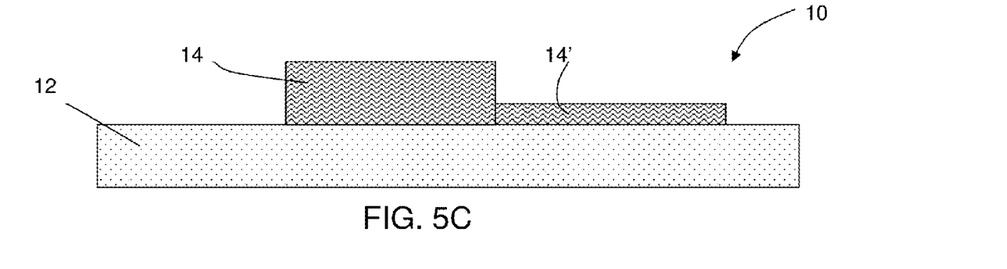

Another exemplary embodiment is shown in FIGS. 5A-5C. In this embodiment, a multilayered graphene film (graphite) nanoelectronic structure 10 as shown in FIG. 5A can be masked and etched as described above in FIGS. 4A-4B to form a patterned graphene structure. A second mask layer 16' is then be applied as shown in FIG. 5B, followed by application of a layer thickness-reducing etch (as described hereinabove) to form a monolayered graphene layer segment 14' connected to the graphene fabric 14 as shown in FIG. 5C. In this exemplary embodiment, the graphene is not fully removed in the patterned areas but is instead etched down to a layer thickness of less than 10 Å in one exemplary embodiment, less than 7.5 Å in another embodiment, and a monolayer thickness in yet another embodiment. Such a technique would be useful for the fabrication of monolayered graphene FET structures that are connected to more highly conducting graphite or graphene interconnect lines (e.g., with thickness greater than 20 Å) without the need for multiple carbon depositions.

Figure 6A:
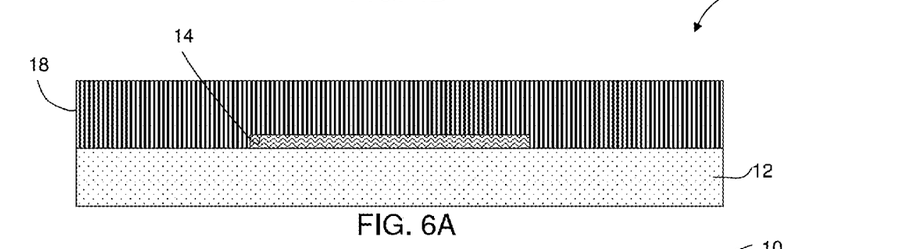
FIGS. 6A and 6B depict a process for forming electrical contacts on a patterned graphene layer segment.
Figure 6B:
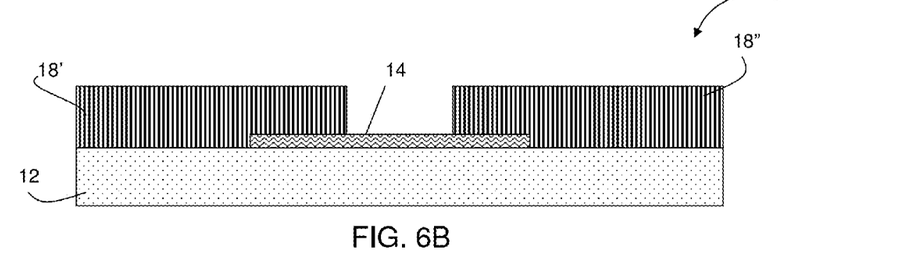

FIGS. 6A and 6B depict the deposition and patterning of metal electrodes on top of the patterned graphene fabric from FIG. 4B. FIG. 6A shows deposition of metal layer 18 onto the structure of FIG. 4B. Standard semiconductor-compatible metals can be deposited; however, to limit damage of the graphene film, metal such as a modified CVD TiN (with hydrogen plasma conditions altered to prevent/limit hydrogen exposure to graphene), CVD W, modified ionized metal plasma (IMP) deposition of Ti (with RF power conditions modified to prevent sputter damage), or any combination of metallization can be used. After deposition, the metal layer 18 may be selectively etched relative to the graphene fabric 14. Because standard metal etch processes may damage the graphene fabric, low power, high pressure chlorine-based metal exposures are used in an exemplary embodiment for patterning the metal layer 18 to form metal electrodes 18' and 18", shown in FIG. 6B, without damaging the electrical properties of the graphene fabric. After the RIE etch, an anneal process as described above may be performed to remove any unwanted functional groups from the graphene fabric 14.

Figure 7A:
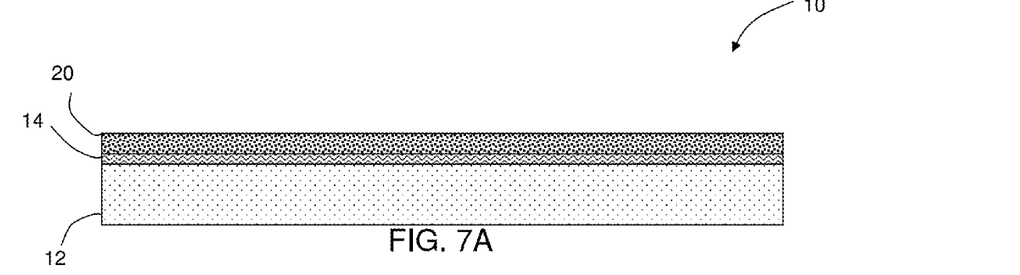
FIGS. 7A-7H depict a process for providing a passivated a graphene layer segment having an insulator layer thereabove, and forming electrical contacts with the graphene layer segment for connection to other electronic nanocomponents on or above the insulator layer.

FIGS. 7A through 7H show a process to passivate graphene nanoelectronic devices as well as form high density stacked graphene devices (e.g., 3-D field effect transistors (FET's) or graphene FETs plus graphene switches, etc.) according to exemplary embodiments of the invention. FIG. 7A shows a graphene layer 14 that is coated with a protective sacrificial layer 20. In an exemplary embodiment, the protective sacrificial layer 20 may be a Si layer or Ge layer, which may be applied by plasma-enhanced chemical vapor deposition (PECVD). For simplicity, only the example of Si may be mentioned in the remainder of the disclosure; however, it should be understood that a variety of materials could be used as the sacrificial protective layer. For compatibility with a front-end process, epitaxial Si can also be used as the sacrificial protective layer 20. The sacrificial protective layer 20 may function as a hard mask (although the graphene fabric can be patterned before deposition of the film), protects the graphene during processing, and may function as a sacrificial layer to form a cavity above the graphene. The properties of the graphene layer 14 may be influenced by interaction with surrounding substrates and materials. Therefore, in one exemplary embodiment of the invention, it may be beneficial to provide a cavity region adjacent to the graphene layer 14 in order to limit the perturbation of graphene's electrical (optical, thermal, chemical, mechanical, etc.) properties from surrounding interfaces. It can also be envisioned that the graphene film is fully suspended in the active region by creating a lower sacrificial cavity region (not shown).

Figure 7B:
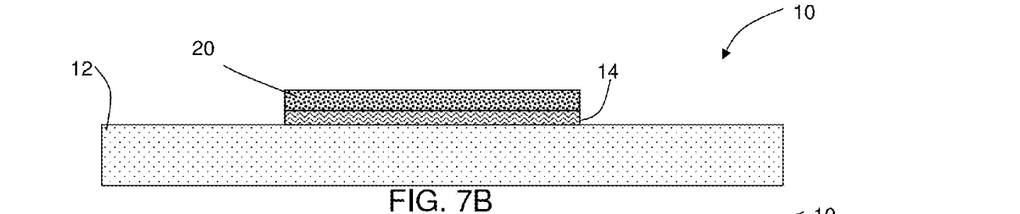
Figure 7C:
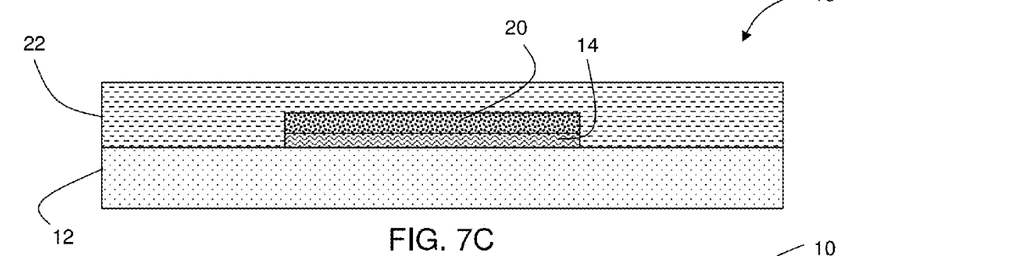
Figure 7D:
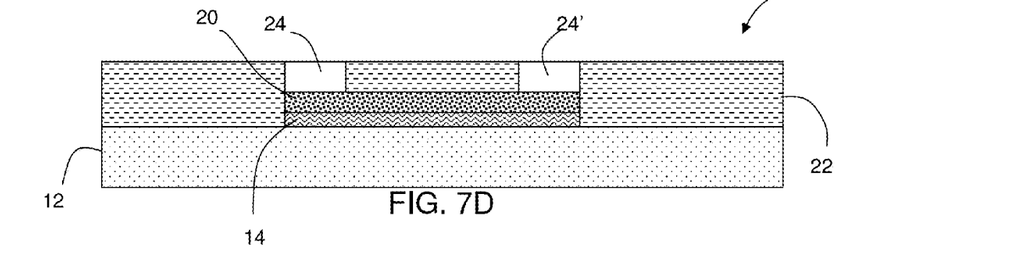
Figure 7E:
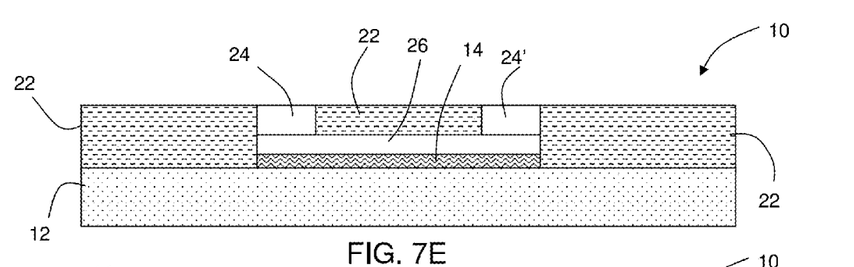

After deposition of the sacrificial protective layer 20, photolithography and etching may be performed to pattern the Si and graphene layers to result in the structure shown in FIG. 7B. RIE may be used for these etches, using materials and conditions as are known in the art. In FIG. 7C, an insulator layer 22 is applied over the structure of FIG. 7B to encapsulate the patterned graphene layer 14 and sacrificial protective layer 20. Any known insulator material may be used, such as $SiO_2$, silicon nitride, or other insulator such as ALD alumina or ALD $HfO_2$, etc. Because of the sensitivity of the thin graphene fabric, the Si layer 20 protects the graphene layer during insulator deposition. After insulator deposition, vias 24, 24' are etched into the insulator layer 22 as shown in FIG. 7d. The etching process used here should be selective to the Si protective sacrificial layer 20 using known RIE conditions. In FIG. 7E, the protective sacrificial layer 20 has been removed to leave cavity 26 above and passivating the graphene layer 14. A protective sacrificial layer such as an Si layer may be removed with a vapor phase etch such as $XeF_2$. Note that a wet etch (e.g., $NH_4OH$ in deionized water for silicon) may also be used; however, capillary forces may prevent effective removal of the sacrificial material. A post etch anneal may also be performed to remove any functionalized molecules on the graphene layer 14.

Figure 7F:
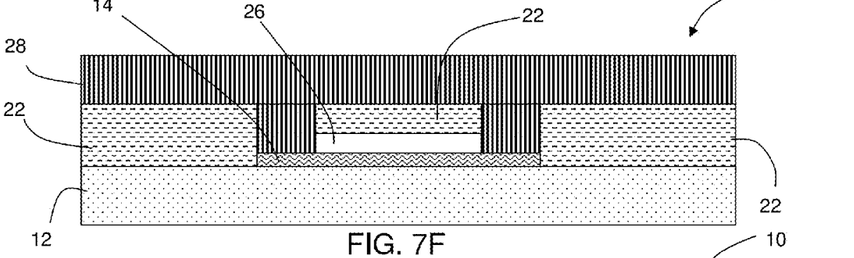
Figure 7G:
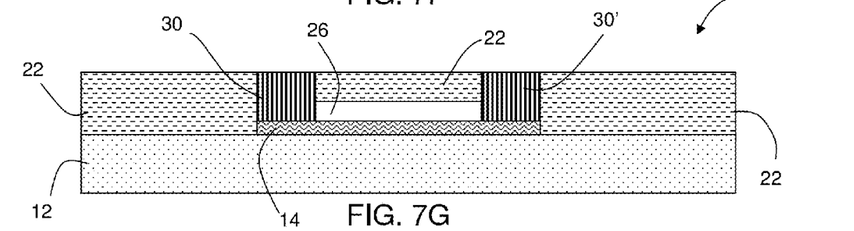
Figure 7H:
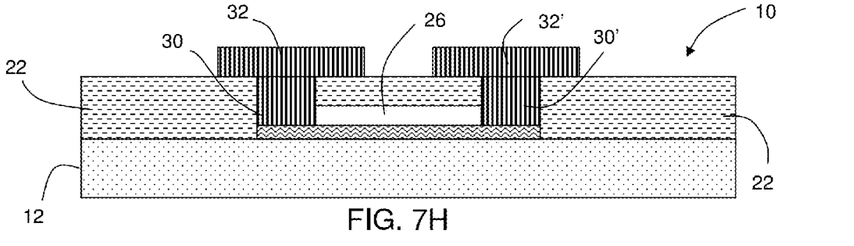

Once the cavity 26 is formed, metal layer 28 is deposited over the structure so as to fill the vias 24, 24', as shown in FIG. 7F. Because the graphene fabric 14 is passivated, a wider process window for metal deposition is possible since there is no need to etch the metal 28 in a fashion so as to be selective to the thin graphene fabric 14. Depending on the metal deposition technique and the route for further processing, the deposited metal can either be planarized using chemical mechanical planarization (CMP), leaving metal interconnects 30, 30' in the vias in electrical contact with the graphene layer 14, as shown in FIG. 7G. Alternatively, the metal layer in 28 from FIG. 7F can be patterned and/or selectively etched to leave metal contacts 32, 32' in contact with interconnects 30, 30' in the vias in electrical contact with the graphene layer 14, as shown in FIG. 7H. The electrical contacts 32, 32' may form an integral part of further nanoelectric circuitry components to be formed on or above the insulator layer 22.

Figure 8A:
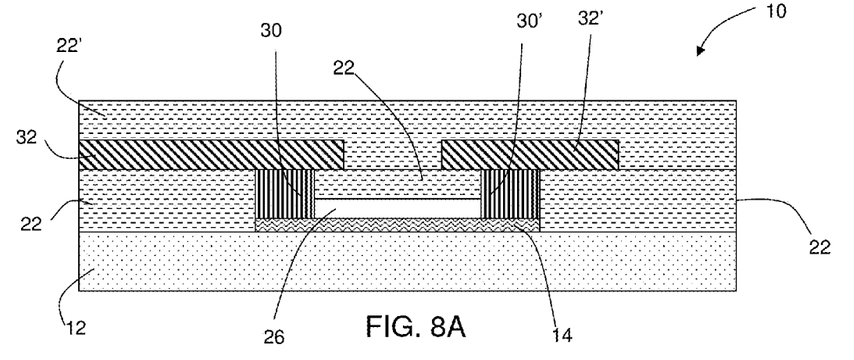
FIGS. 8A and 8B depict the formation of additional electronic nanocomponents for the formation of a field effect transistor.
Figure 8B:
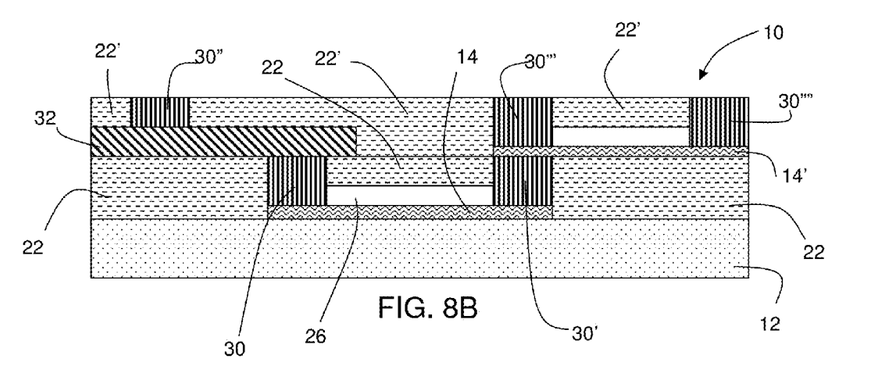

FIGS. 8A and 8B illustrate the ability to perform additional processing to form additional nanocircuitry components on top of the passivated graphene nanoelectronic device from FIG. 7G. FIG. 8A shows a single graphene device that has been interconnected with a second metal, forming metal components 32, 32', and then further encapsulated with metal two and further encapsulated with second insulator layer 22'. FIG. 8B shows an example of a stacked graphene nanoelectronic device where a second graphene layer 14' has been deposited on top of the structure from FIG. 7G and protected with a second protective sacrificial layer (not shown) for passivation as was done for graphene layer 14. Second metal component 32 is also deposited on top of the structure from FIG. 7G, and the structure is encapsulated by second insulator layer 22'. Vias for electrical interconnects 30'', 30''', 30'''' are then etched into the second insulator layer 22' and the second protective sacrificial layer is removed to passivate the second graphene layer 14', followed by deposition of metal into the vias to form electrical interconnects 30'', 30''', 30''''. The structure shown in FIG. 8B could be the basis of a simple graphene inverter (gate electrodes not shown for simplicity), other graphene gates, or any high-density stacked graphene nanoelectronic architecture.

Embodiments of the present invention may be used in a variety of electronic applications, including but not limited to advanced sensors, memory/data storage, semiconductors and other applications.

A reference to an element in the singular is not intended to mean "one and only one" unless specifically stated, but rather "one or more." The term "some" refers to one or more. Underlined and/or italicized headings and subheadings are used for convenience only, do not limit the invention, and are not referred to in connection with the interpretation of the description of the invention. All structural and functional equivalents to the elements of the various embodiments described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

Having thus described the invention, it is claimed:

1. A method of manufacturing a solid state electronic nanostructure including at least one graphene layer segment, comprising the steps of:
   depositing or forming the graphene layer segment on a support;
   depositing a protective sacrificial layer over the graphene layer segment;
   depositing an electrically insulating layer over the protective sacrificial layer;
   etching one or more openings in the electrically insulating layer;
   removing the protective sacrificial layer to form a cavity between the graphene layer segment and the electrically insulating layer, thereby passivating the graphene layer segment;
   depositing an electrically conductive material into the one or more openings in the electrically insulating layer to form one or more electrical contacts with the graphene layer segment; and
   depositing or forming one or more additional solid state electronic nanocomponents on or above the electrically insulating layer in electrical contact with the graphene layer segment through said electrical contacts.

2. The method of claim 1, wherein the sacrificial protective layer is silicon or germanium.

3. The method of claim 1, further comprising the step of patterning the graphene layer segment using the protective sacrificial layer as a hard mask.

* * * * *